Figure 1:
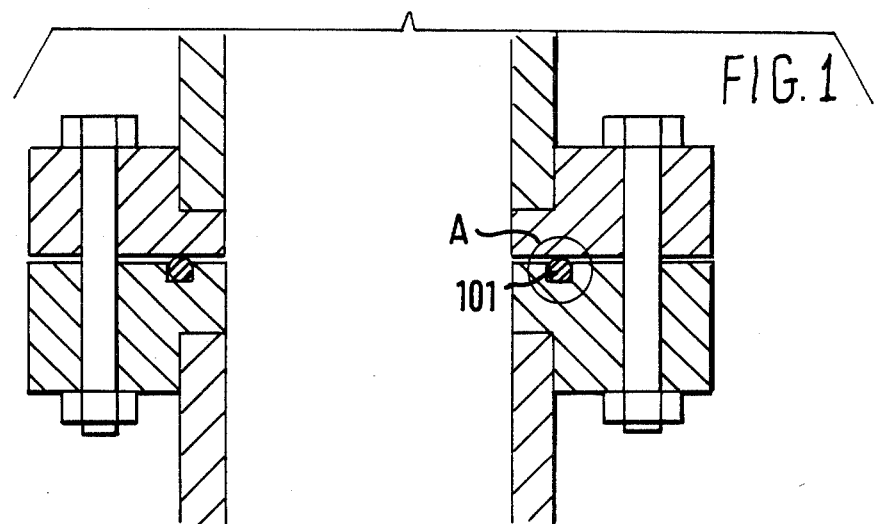

United States Patent [19]

Aitken

[11] Patent Number: 4,580,619
[45] Date of Patent: Apr. 8, 1986

[54] COMPONENTS FOR EVACUATED EQUIPMENT

[76] Inventor: Derek Aitken, 49 Park Rd., East Molesey, Surrey, England

[21] Appl. No.: 310,841

[22] Filed: Oct. 13, 1981

Related U.S. Application Data

[63] Continuation-in-part of Ser. No. 308,659, Oct. 5, 1981, which is a continuation of Ser. No. 136,677, Apr. 2, 1980, abandoned.

[30] Foreign Application Priority Data

Jan. 23, 1981 [GB] United Kingdom ............... 8102156

[51] Int. Cl.$^4$ .............................................. F28F 7/00
[52] U.S. Cl. ........................................ 165/1; 118/724; 118/728; 165/46; 165/83; 165/185; 165/80.5; 250/492.2
[58] Field of Search ...................... 250/492.2, 238, 398, 250/429; 165/46, 83, 1, 80 R, 80 A-E, 185, DIG. 8; 118/724, 728

[56] References Cited

U.S. PATENT DOCUMENTS

| | | | |
|---|---|---|---|
| 2,793,282 | 5/1957 | Steigerwald | 250/398 X |
| 2,967,984 | 1/1961 | Jamison | 165/DIG. 8 |
| 3,294,661 | 12/1966 | Maissel | 204/192 R |
| 3,764,511 | 10/1973 | Glick et al. | 118/728 |
| 3,965,973 | 6/1976 | Thetlu et al. | 165/185 X |
| 4,009,423 | 2/1977 | Wilson | 165/46 X |
| 4,072,188 | 2/1978 | Wilson et al. | 165/46 X |
| 4,092,697 | 5/1978 | Spaight | 361/386 |
| 4,282,924 | 8/1981 | Faretra | 165/80 E |

OTHER PUBLICATIONS

Ultra-High Vacuum Evaporation/Sputtering Apparatus for Cryogenic Thin Film Technology, Carbone et al., IBM Tech. Disc. Bull., vol. 22, No. 2, Jul. 1979, pp. 550–554.

Primary Examiner—Sheldon J. Richter
Attorney, Agent, or Firm—William R. Hinds

[57] ABSTRACT

Evacuable equipment wherein for effective thermal transfer use is made of a thermally conductive fluid confined by a flexible diaphragm for heat transfer across the diaphragm between the fluid and a component forming part of or being treated in the equipment and situated under vacuum in thermal contact with the diaphragm, said diaphragm comprising a flexible gas-impermeable metal layer preventing uptake of gases by the fluid when the equipment is not under vacuum.

20 Claims, 7 Drawing Figures

COMPONENTS FOR EVACUATED EQUIPMENT

This application is a continuation-in-part of application Ser. No. 308,659, filed Oct. 5, 1981 entitled "Evacuated Equipment" in the name of the present inventor, itself a continuation of his application Ser. No. 136 677 of Apr. 2, 1980 (now abandoned). The inventor's European patent application No. 80 3 01039.6, published as No. 0 017 472 on Oct. 15, 1980 (Lintott Engineering Limited), is the equivalent of Ser. No. 136 677.

The invention relates to flexible components for use in high vacuum technology and to equipment using such components.

Various types of elastomer are extensively used to provide flexible components in high vacuum technology, for example as flange sealing gaskets so that high vacuum can be achieved in systems with demountable flanges. The elastomers used need to have:
(i) a low vapour pressure so as not to contaminate the vacuum;
(ii) resistance to the temperature (>100° C.) applied in outgassing;
(iii) low permeability to atmospheric gases.

These requirements are difficult to meet for a vacuum higher for example that $1 \times 10^{-8}$ torr in particular in respect of permeability.

In one aspect of the invention therefore we have considered how elastomers can be made impermeable to atmospheric and other gases without loss of the physical properties, particularly flexibility, for which they are used. An impermeable barrier applied to the elastomer appeared to us to be the only way, the requirements being:
(i) that the barrier must be impermeable to atmospheric and other gases;
(ii) that the barrier must be highly adherent to the elastomer;
(iii) that the barrier must be flexible.

We have found, surprisingly, that a metal layer, preferably applied by the process known as ion plating, can both prevent permeation of gases and be flexible and adherent enough to allow the flexibility of the elastomer to be made use of.

The invention therefore in the present aspect provides a seal, diaphragm or other elastomer component for use in high vacuum equipment, carrying a gas-impermeable, flexible and adherent metal layer over or beneath the whole of its surface or such part as is exposed to permeation of gases before or during such use.

The invention in the present aspect also resides in a method of providing high vacuum equipment with a gas-impermeable seal, diaphragm or other elastomer component wherein said component is coated with a gas-impermeable, flexible, adherent metal layer over or beneath at least the part of its surface exposed to permeation of gases in use of the equipment. The metal layer may be applied before assembly if the elastomer is only slightly flexed but if substantial flexing, or stretching, is involved the metal layer should be applied after assembly.

Flexing without risk of cracking of the metal layer or even separation of the metal and elastomer can further be allowed for where the flexing is considerable by corrugating the elastomer surface and hence the applied metal layer and then if desired when a smooth surface is required on the component, applying a further layer of elastomer over the layer. The thickness of the metal layer may when corrugated by substantially thicker than a simple layer, for example 10–100 microns, conveniently 15 or 30 microns.

Among elastomer components that are suitable for application of the invention are sealing gaskets and for example coated 'O' rings:
(i) to improve the ultimate vacuum capability of conventional vacuum systems (i.e. 'O' ring sealed, not ultra high vacuum metal gasket sealed), or
(ii) to give protection from chemical attack, e.g. against boron trifluoride, which when used for example in ion implantation equipment, attacks fluorocarbon rubbers used for 'O' rings.

A specific application of the invention is in heat transfer in evacuated equipment, for example equipment for ion or electron beam bombardment of targets, and in particular ion implanters for the processing of semiconductor components.

In many circumstances reliable thermal contact is required within evacuated eqiupment, either between separate parts of the equipment or between parts of the equipment and components being processed in it.

In particular, silicon wafers undergoing high-dose ion implantation have very poor and unpredictable thermal contact with the heat sinks necessary to prevent them overheating, and implantation for applications such as solar cell manufacture and predeposition implantation has to be either intermittent or at low power to allow heat dispersal.

The principle of the present invention in this application is to make use, for effective thermal transfer, of a thermally conductive fluid, confined by a flexible diaphragm, for heat transfer across the diaphragm between the fluid and a component placed in thermal contact with the diaphragm. In particular the fluid, confined by its flexible diaphragm, may be disposed between one part of equipment and another, or between a part of the equipment and a component being processed in it, with the diaphragm in contact with that other part or component.

Said diaphragm may be of elastomer having a metal layer as described above to obviate problems of gas permeation into said fluid during construction of the equipment or at times when the vacuum has been released.

In a still further aspect of the invention in such an application, a corrugated metal diaphragm itself confines the fluid, without use of an elastomer, being made for example of aluminium or tantalum. The 'metal layer' referred to above and later herein, including in the claims, then constitutes the diaphragm.

The invention in this application correspondingly extends to a thermal transfer unit or heat sink module comprising a mounting, a flexible diaphragm secured to the mounting, and, confined between the mounting and the diaphragm, a body of fluid for conduction of heat between the mounting and, in use, a component requiring heating or cooling and placed in thermal contact with the diaphragm, the diaphragm being as above.

The use of the diaphragm allows effective heat transfer not at a few isolated points as on contact between rigid bodies when convective heat transfer is absent under vacuum but across the contact area as a whole, the diaphragm conforming closely to the surface of the part or component, either throughout its surface or, where the diaphragm is corrugated, by a part of the surface that nevertheless gives substantial and regularly distributed thermal contact. Contact is maintained by any convenient means, for example clips for individual components.

The heat sink modules are enhanced as a product in other ways than rendering them impermeable, in particular in that the film, which is not itself damaged by ion implantation of semiconductor dopants (e.g. boron, phosphorus, arsenic, antimony etc.), is thick enough to prevent ions reaching the elastomer, which is in time degraded by ion implantation procedures. High-dose ion implantation of silicon wafers is possible at far higher power than when using prior heat sinks.

The thickness of the film and the nature of the metal, desirably a ductile metal such as aluminium or tantalum, to be used, and the details of application of the film are a matter of simple trial. For example it is satisfactory to use ion plated aluminium on "Viton" rubber (a Du Pont Trade Mark for a fluorocarbon rubber). Silicone rubbers are also suitable though air permeation through them may be inconvenient in manufacture of heat sinks for example, when the fluid has been in place but the metal layer has not yet been applied.

In simple metal layers e.g. on an O-ring a 1-micron layer is sufficient and is flexible enough for assembly. In application such as heat sinks where mechanical strength to allow repeated assembly with a component for example for ion implantation is necessary a layer that is simply thicker may give difficulty forming cracks that are not visible but nevertheless allow gas permeation, and then a corrugated layer should be used. A spiral corrugation is convenient, for example moulded into the rubber before ion plating. It ensures that air behind the component readily escapes on evacuation of the equipment in a way that concentric corrugations for example would not. The form of the corrugations should be regular and smooth for example in a sine wave formation, so that no stress raising edges leading to cracking of the metal layer are present.

In the ion plating process, which is known in itself, a metal is vapour deposited onto a surface through a glow discharge. This discharge cleans the surface to be coated and also ionises a fraction of the metal atoms which are then implanted into the surface to be coated. These two factors lead to excellent adhesion, a characteristic of the ion plating process.

For the particular case of the heat sink modules the most suitable metals are aluminum and tantalum. Aluminium has the advantage of being widely used as a thin metal film in other contexts so that facilities are available for its application. It does in theory have the potential disadvantage of being a dopant for silicon with some risk should any part of a film become damaged but in practice no trouble is met. Tantalum is a good material as it is non-doping, ductile and refractory.

In principle there is no restriction on the fluid used in thermal transfer and particularly heat sink units as above but preferably it is chosen for high heat conductivity and, as a safeguard against contamination of the equipment should the diaphragm be damaged, low vapour pressure.

By low vapour pressure we mean $1 \times 10^{-5}$ torr or less, preferably $1 \times 10^{-9}$ torr or less, at 30° C., that is to say vapour pressures in the high vacuum range. Fluids meeting this requirement include certain commercially available high vacuum oils comprising fluorinated polyphenol ethers, for example "Fomblin" 140/13 (Montedison) which has a vapour pressure of $2 \times 10^{-12}$ torr at 20° C., and low-melting point metals such as gallium and its binary or ternary alloys with indium and tin. The metals may be preferable if a layer of fluid of substantial thickness is being used, for good thermal transfer, or alternatively a fluid such as one of the above oils loaded with a finely divided solid material of higher heat conductivity, for example silver or other metal, graphite or boron nitride. Graphite is available in high heat conductivity grades and has the particular advantage that its density is near that of the oil and settling out is unlikely.

It will be understood that the term fluid is used herein to cover materials that are liquid or alternatively pasty or viscous, and which further may contain solid materials as described above. Gaseous materials are excluded, as unsuitable for effective thermal transfer. They would in any event exert undesired pressure on the flexible diaphragm in an evacuated system and risk contaminating the whole system in the event of a rupture.

While 'low vapour pressure' is defined above in terms of the vapour pressure at certain temperatures, no particular limitation on the operating temperature of the equipment is envisaged. The fluid used simply has to be matched to the operating temperature. Gallium for example melts at 29.8° C., indium at 156.6° C., tin at 232° C., and the binary eutectic of indium and tin (52 wt % indium) at 117° C., providing alternatives to the low melting point alloys discussed below if desired. If operation at raised temperatures is required, for example in a heating rather than cooling application, the vapour pressures are still very low, for example $1 \times 10^{-28}$ torr for gallium at 100° C. and indeed still in the ultra high vacuum range of $1 \times 10^{-11}$ torr at 400° C.

Generally and in particularly in ion implanters, the temperatures envisaged are water cooling temperatures of 10° to 25° C. at the final heat sink. At these temperatures suitable metals are for example (weight compositions):

Ga 92%, Sn 8%, m.p. 20° C.
Ga 76%, In 24%, m.p. 16° C.
Ga 62.5%, In 21.5%, Sn 16%, m.p. 10.7° C.
Ga 69.8%, In 17.6%, Sn 12.5%, m.p. 10.8° C.

The vapour pressures of all these alloys are very low, being for the individual metals:

| | | |
|---|---|---|
| Ga | (29.8° C.) | $1 \times 10^{-36}$ torr |
| In | (30° C.) | $1 \times 10^{-32}$ torr |
| Sn | (30° C.) | $1 \times 10^{-36}$ torr |

There are no serious compatibility problems between the gallium-based liquid metals and containment and structural materials. Stainless steel and copper are both suitable at moderate temperatures, though the stainless steel is less good for heat transfer. Above 100° C. chromium plated copper is very suitable, having an excellent resistance to attack up to 400° C.

Figure 1A:
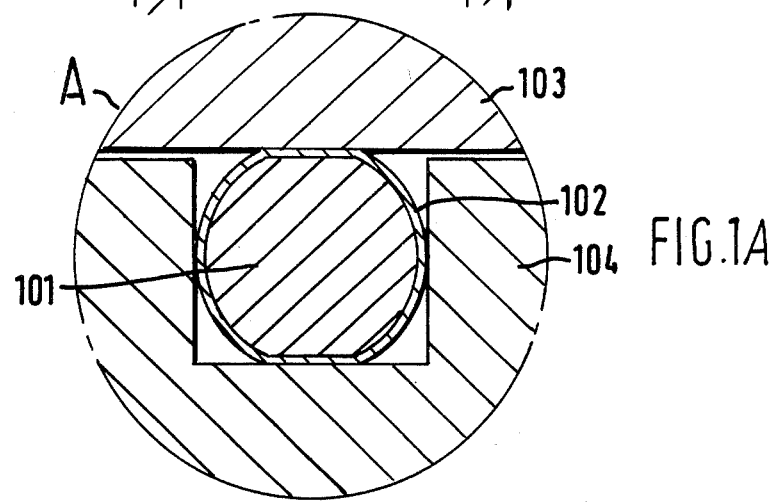
Figure 5:
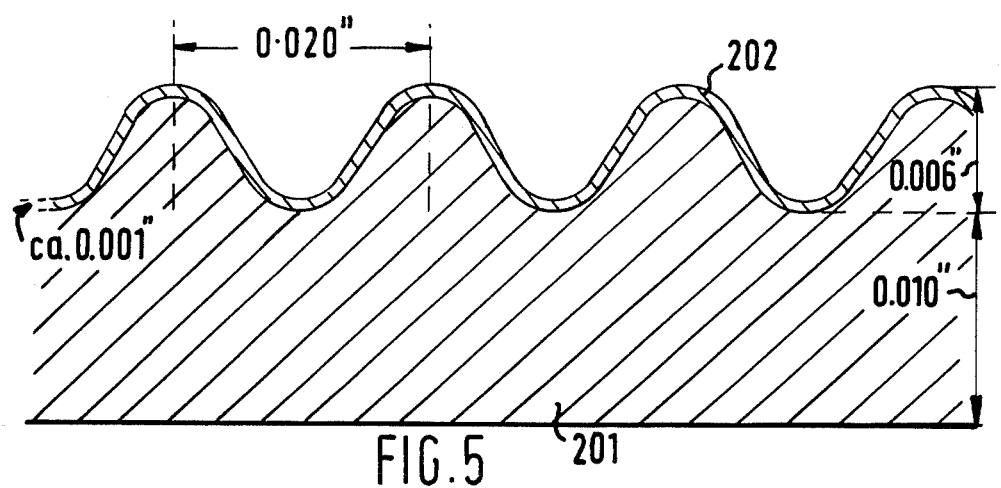
Figure 2:
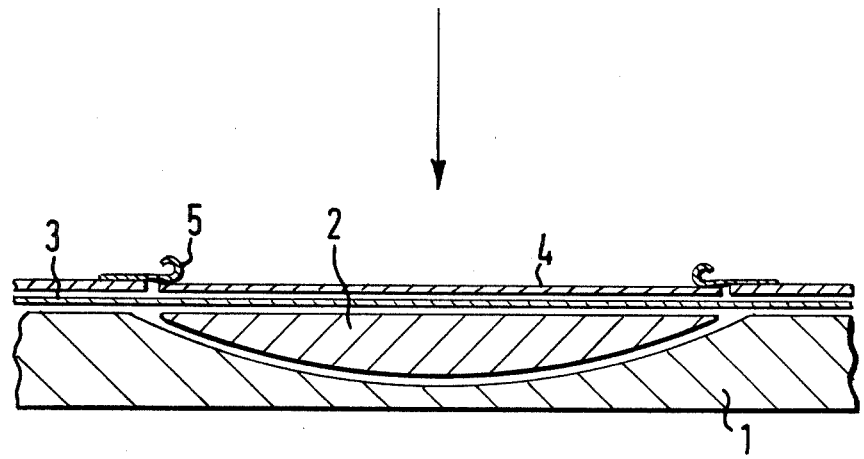
Figure 3:
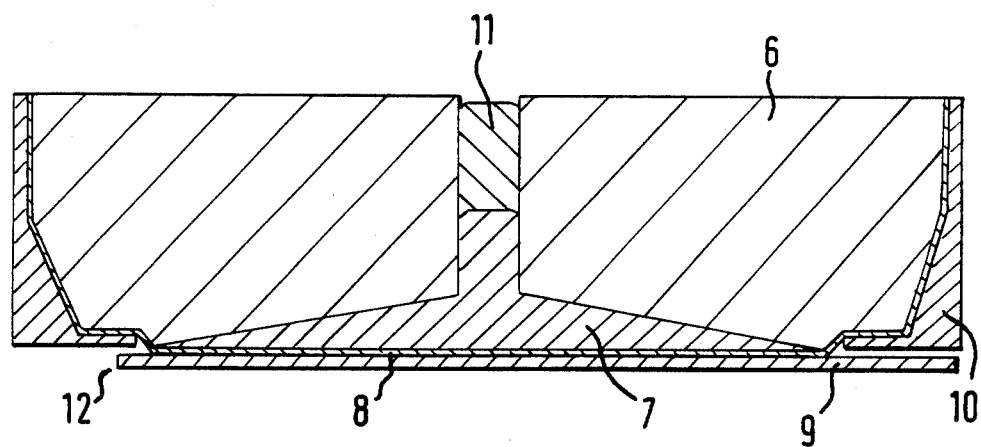
Figure 4:
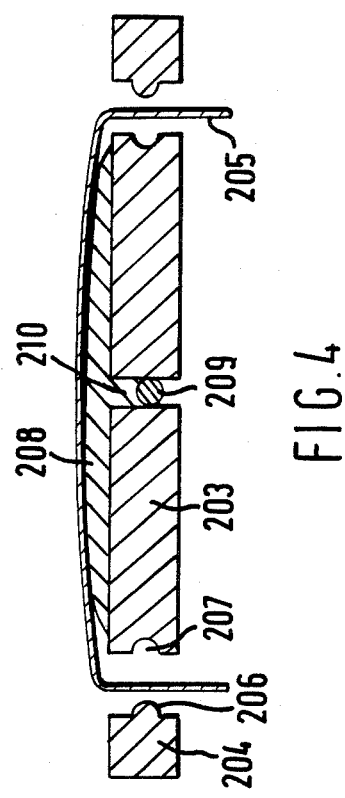
Figure 6:
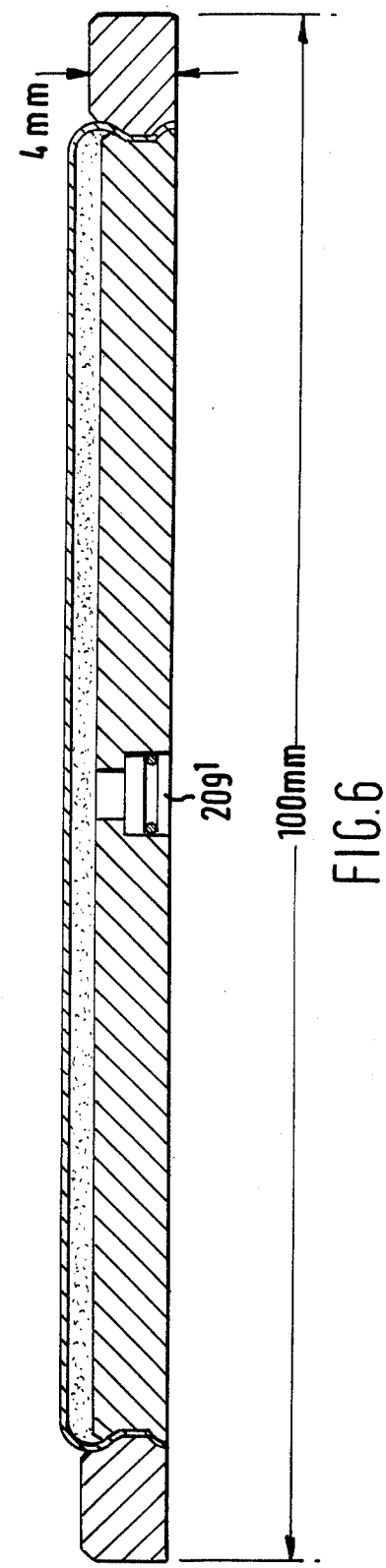

The invention is illustrated in the accompanying drawings in which:

FIG. 1 shows an O-ring and flange assembly;
FIG. 1A is an enlargement of encircled portion A of FIG. 1;
FIG. 2 is a sketch of a silicon wafer in position on a heat sink;
FIG. 3 is as FIG. 2 but in detail;
FIG. 4 shows a further heat sink;
FIG. 5 is a section of a small part of a corrugated diaphragm; and
FIG. 6 is as FIG. 4, fully drawn, with a modification thereof.

In FIG. 1 a typical bolted flange assembly is shown sealed with a "Viton" O-ring 101, prior to tightening up. The enlarged insert of FIG. 1A shows the O-ring as compressed and a 1-micron thick metal layer of aluminium 102 preventing permeation of gases passing between the flanges 103, 104 which do not themselves offer a full seal.

In FIG. 2, the heat sink 1, body of liquid metal alloy 2 or other heat transfer fluid, diaphragm 3, wafer 4 and clips 5 are all shown slightly separated for clarity. In fact of course the fluid fills the space between the diaphragm and the heat sink, which are fixed together as a unit and the wafer is closely applied to the diaphragm by the clips. Heat is finally lost by water cooling at for example 17° C. The material of the diaphragm is 0.005 inch silicone rubber sheet having a 1-micron layer of ion-deposited aluminium (not separately referenced) on the upper face, and for example at a heat flow of 1 watt/sq cm the temperature gradient over an 0.005 inch thick silicone rubber diaphragm is 6° C. A typical heat flow in solar cell implantation is 5 watts/sq cm, giving a temperature gradient of 30° C. At ordinary ambient temperature of 20° C. this gives a wafer temperature a long way below the level of 100° C. at which for example problems with photoresist coatings are found.

FIG. 3 shows a diaphragm and associated parts in detail, designed for easy production. The diaphragm is desirably slightly stretched, so as not to wrinkle in use, and also to have an amount of fluid behind it that will make it slightly convex at rest. It is therefore metal coated after assembly of the unit. A wafer clipped over it comes in firm contact over essentially the whole surface of the diaphragm. The parts are a water cooled chromium plated copper heat sink disc 6, a body of liquid metal alloy or other heat transfer fluid 7, a silicone rubber diaphragm 8, a silicon wafer 9 and an outer clamp ring 10 holding the diaphragm in place. The fluid is confined by a plug of silicone rubber encapsulant 11 in a bore in the heat sink disc.

Production is as follows, referring to the parts shown in the FIG. and to the use of metal alloy:
1. Place the outer clamp ring face down on a flat surface;
2. Coat the inner surface of the ring with silicone rubber adhesive and then place the silicone rubber diaphragm on top of the ring;
3. Coat the outer surface of the heat sink disc with the adhesive and carefully press the disc into position in the clamp ring, allowing the diaphragm to stretch slightly;
4. After the adhesive is dry, place the assembly on a shallowly concave surface in an evacuable enclosure and pour in liquid metal alloy (L.M.A.) through the central filling hole in the disc until the meniscus reaches a position, previously determined in conjunction with the concavity of the surface, that gives a proper amount of alloy in the assembly;
5. Evacuate the assembly, allowing any trapped air bubbles to escape (the concave lower face of the heat sink disc makes such escape easy);
6. Vent to atmosphere, top up with alloy if necessary, and seal the filling hole with liquid encapsulant;
7. Re-evacuate, to remove any bubbles from the encapsulant or the encapsulant/metal interface;
8. Vent and allow encapsulant to cure.
9. Subject to ion plating.

Typical dimensions are 4 mm depth and 75 mm, 100 mm or 125 mm assembly diameter. The heat sink disc is of chromium plated copper, the clamp ring for example of steel, turned as shown or pressed. It will be noted that the silicon wafer when in position covers the diaphragm entirely, including the position 12 of the flat normally present on the wafers. The area of the wafer not in contact with the diaphragm (exaggerated in the drawing) is unimportant.

The alternative heat sink shown in FIGS. 4 and 5 uses an alternative diaphragm material of "Viton" nominal thickness 0.016 inch. The diaphragm 201 is corrugated as seen in FIG. 5 with a spiral groove extending over the surface exposed in the assembled heat sink. The pitch of the spiral is 0.020 inch and its depth 0.006 inch, the form approximating to a smooth sine curve. A depth of 0.010 inch of the "Viton" in thus left ungrooved. The thickness of ion plated aluminium 202 is 0.001 inch approx. (in fact 30 microns), applied after assembly of the heat sink.

As shown in FIG. 4 the heat sink consists of a 90 mm diameter centre disc 203 and an outer ring 204, both of aluminium and giving an overall diameter of 100 mm and depth 4 mm. The diaphragm is indicated at 205 and is held in place by a co-operating ridge and groove formation 206, 207. All clearances are exaggerated in the FIG., which shows the heat sink in the course of assembly.

In assembly, a puddle of the heat transfer fluid 208, here "Fomblin", is placed on the centre disc (or filled through a bore 210 subsequently), the diaphragm is located, and the outer ring preheated to expand it is pressed over the diaphragm. As the ring cools the diaphragm is drawn into the groove 207 and firmly held, the ring itself of course also being unable to be displaced. A ball bearing 209 or an 'O' ring sealed plug 209' (FIG. 6) is then forced into a receiving bore 210 in the centre of the disc. The assembly is baked to drive out all gases adsorbed on the surfaces or present in the Fomblin. Finally the clean assembly is ion-plated to give the aluminium layer as shown in FIG. 5.

The ability to make a heat sink under ordinary conditions and bake the assembly to drive out all gases is a valuable feature. The final metallised assembly can of course be kept under atmospheric conditions.

It will be appreciated that the above description is of individual heat sinks used in ion implantation equipment loaded under atmospheric pessure and evacuated for the implantation process. Where a fixed heat sink assembly is used similar units are suitable but it is also possible to use for example a corrugated metal diaphragm permanently installed and pumped clean thereafter by connecting a bore such as 210 to the vacuum system. In such an assembly the fluid may even be a circulating fluid if desired, no limitation to the invention as shown in the embodiments with fixed, sealed amounts of fluid being intended.

The important thing in any event is the direct surface-conforming thermal contact the diaphragm gives for heat transfer and, in the application of the invention as chiefly described above the fact that said contact is temporary and separable without difficulty and without any question of contamination of components being treated.

All the above modules have shown excellent resistance to atmospheric gas permeation, and do not need to be stored in vacuum. Modules exposed to air for many weeks have still functioned perfectly when they are placed in vacuum indicating that there is no air bubble formation in the modules which would reduce their effectiveness.

Further the modules are resistant to the most penetrating ion commonly used in semiconductor ion implantation, which is 200 KeV boron. This has a range in aluminium of approximately ½ micron. Therefore a 1 micron aluminium film will protect the rubber from ion bombardment damage.

What is claimed is:

1. In a method of effecting heat transfer between a component and a heat sink while the component is subjected to ion or electron beam bombardment or other processing in an evacuated space in which the component is temporarily located, the improvement comprising enhancing the heat transfer by locating the component in said space in separable, direct, surface-conforming, thermal contact with one face of a flexible diaphragm confining on its other face a thermally conductive fluid which is in thermal communication with said heat sink so as to effect heat transfer across the surface-conforming portion of the diaphragm between the component and the fluid and hence the heat sink, processing the component under vacuum and thereafter separating the component from the diaphragm and removing the component from said space, the diaphragm comprising a flexible gas-impermeable metal layer preventing uptake of gases by said fluid when said space is not under vacuum.

2. A method as claimed in claim 1 wherein said component is a semi-conductor component undergoing ion implantation under evacuated conditions.

3. A method as claimed in claim 1, wherein said metal layer is corrugated to increase flexibility.

4. A method as claimed in claim 3, wherein said corrugation is in the form of a spiral groove allowing escape of gas lying between said diaphragm and a component placed in thermal contact with the diaphragm when the unit is under vacuum.

5. A method as claimed in claim 1, claim 3 or claim 4, wherein the metal layer is present on a carrier diaphragm of an elastomer, the metal layer extending over or beneath the surface of the diaphragm over at least the whole part exposed to permeation of gases when the unit is not under vacuum.

6. A method as claimed in claim 5, wherein the metal layer has been applied to the elastomer by ion plating.

7. In combination, a vacuum chamber; heat sink body positioned in said vacuum chamber, said body being formed of solid material having high thermal conductivity and having one major face with a recessed region formed therein; a diaphragm of flexible material mounted over said major face of said heat sink body and being rigidly clamped at edge regions thereof to said body to form with said recessed region a liquid tight enclosure; a heat transfer liquid filling said liquid tight enclosure and having a volume sufficient to form said diaphragm normally into a slightly convex shape, thereby providing substantially continuous contact with a flat wafer element positioned on said diaphragm and urged into positive contact therewith by an applied clamping force to achieve good direct heat transfer from said wafer into said heat sink body through said heat transfer liquid; said diaphragm comprising a flexible gas-impermeable metal layer preventing uptake of gases by said fluid when said vacuum chamber is not evacuated.

8. In evacuable equipment, the improvement for effecting effective thermal transfer comprising a thermally conductive fluid confined by a flexible diaphragm for heat transfer across the diaphragm between the fluid and a component situated under vacuum in thermal contact with the diaphragm, said diaphragm comprising a flexible gas-impermeable metal layer preventing uptake of gases by the fluid when the equipment is not under vacuum, wherein said metal layer is corrugated to increase flexibility.

9. Equipment as claimed in claim 8, wherein said corrugation is in the form of a spiral groove allowing escape of gas lying between said diaphragm and component on evacuation of the equipment.

10. In combination, in evacuable equipment, the improvement for effecting effective thermal transfer comprising a thermally conductive fluid confined by a flexible diaphragm for heat transfer across the diaphragm between the fluid and a component situated under vacuum in thermal contact with the diaphragm, said diaphragm comprising a flexible gas-impermeable metal layer preventing uptake of gases by the fluid when the equipment is not under vacuum.

11. Equipment or unit according to claim 10, wherein the fluid has a vapour pressure of at most $1 \times 10^{-5}$ torr at 30° C.

12. Equipment or unit according to claim 10, wherein the fluid has a vapour pressure of at most $1 \times 10^{-9}$ torr at 30° C.

13. Equipment or unit according to claim 10, wherein the fluid is a fluorinated polyphenyl ether high vacuum oil.

14. Equipment or unit according to claim 10, wherein the fluid contains a finely divided solid material of higher thermal conductivity than the fluid.

15. Equipment or unit according to claim 10, wherein the fluid contains a finely divided solid material selected from silver, other metals, graphite and boron nitride.

16. Equipment or unit according to claim 10, wherein the fluid is a metal, as such or as an alloy.

17. Equipment or unit according to claim 10, wherein the fluid is gallium or gallium alloy of melting point below 29.8° C.

18. Equipment or unit according to claim 10, wherein the fluid is gallium or gallium/indium, gallium/tin or gallium/indium/tin alloy.

19. Equipment as claimed in claim 10, 8 or 9, wherein the metal layer is present on a carrier diaphragm of an elastomer, the metal layer extending over or beneath the surface of the diaphragm over at least the whole part exposed to permeation of gases when the equipment is not under vacuum.

20. Equipment as claimed in claim 19, wherein the metal layer has been applied to the elastomer by ion plating.

* * * * *